United States Patent [19]
Jones

[11] Patent Number: 6,127,663
[45] Date of Patent: Oct. 3, 2000

[54] ELECTRONICS CABINET COOLING SYSTEM

[75] Inventor: Clifford T. Jones, Raleigh, N.C.

[73] Assignee: Ericsson Inc., Research Triangle Park, N.C.

[21] Appl. No.: 09/169,362

[22] Filed: Oct. 9, 1998

[51] Int. Cl.$^7$ ...................................................... H05B 3/10
[52] U.S. Cl. .......................... 219/553; 219/209; 361/724
[58] Field of Search ................................... 219/520, 521, 219/524, 530, 538, 540, 552, 553, 385, 386, 209, 210, 444.1, 400, 491; 361/724, 725, 726, 727; 312/236; 392/379, 383; 34/76, 77

[56] References Cited

U.S. PATENT DOCUMENTS

| | | | |
|---|---|---|---|
| 1,943,575 | 1/1934 | Abendroth | 219/400 |
| 3,221,729 | 12/1965 | Beasley et al. | 219/400 |
| 3,261,650 | 7/1966 | Stromqvist | 219/400 |
| 3,553,426 | 1/1971 | Fink | 219/210 |
| 3,779,710 | 12/1973 | Burnstein et al. | 219/553 |
| 3,816,702 | 6/1974 | Green | 219/209 |
| 3,816,705 | 6/1974 | Ebert | 219/553 |
| 3,995,143 | 11/1976 | Hervert | 219/553 |
| 4,092,390 | 5/1978 | Mulvany, Jr. | 219/400 |
| 4,227,068 | 10/1980 | Carter | 312/236 |
| 4,384,191 | 5/1983 | Guibert | 219/400 |
| 4,753,496 | 6/1988 | Bussard | 312/236 |
| 4,763,638 | 8/1988 | Hurley et al. | 219/400 |
| 4,860,163 | 8/1989 | Sarath | 361/724 |
| 4,935,604 | 6/1990 | Allen et al. | 219/400 |
| 5,228,212 | 7/1993 | Turetta et al. | 34/77 |
| 5,254,839 | 10/1993 | Laine | 219/209 |
| 5,398,159 | 3/1995 | Andersson et al. | 361/724 |
| 5,574,627 | 11/1996 | Porter | 219/209 |
| 5,606,640 | 2/1997 | Murphy | 219/521 |
| 5,620,623 | 4/1997 | Baker | 219/400 |
| 5,696,872 | 12/1997 | Seward | 219/400 |
| 5,781,410 | 7/1998 | Keown et al. | 361/727 |
| 5,801,632 | 9/1998 | Opal | 361/724 |
| 5,899,001 | 5/1999 | Layton | 219/400 |
| 5,909,534 | 6/1999 | Ko | 219/553 |

*Primary Examiner*—Teresa Walberg
*Assistant Examiner*—Fadi H. Dahbour
*Attorney, Agent, or Firm*—Coats & Bennett, PLLC

[57] ABSTRACT

A cabinet for housing telecommunications equipment in outdoor locations includes an enclosure for containing the telecommunications equipment. A subrack is mounted within the enclosure. A duct directs ambient air from outside the cabinet to the subrack. The duct includes an inlet disposed in a lower portion of the cabinet and a subrack inlet plenum disposed immediately below the subrack. A subrack exit plenum is disposed above the electronic subrack for exhausting air heated by the electronics equipment. A fan draws ambient air into the inlet through the duct into the subrack inlet plenum, through the electronic subrack into the subrack exit plenum, and out of the enclosure through the subrack exhaust plenum. A heater is provided for heating inlet air when ambient temperatures are low. The fan and heater are controlled by a thermal controller. At low ambient temperatures, the air flow is maintained constant by the fans and power to the heater is varied to maintain the subrack inlet temperature constant. At moderate temperatures, the heating element is turned off and the fan speed is varied up to the maximum fan speed. At high temperatures, the fans operate at full speed to maintain maximum air flow.

30 Claims, 6 Drawing Sheets

ELECTRONICS CABINET COOLING SYSTEM

FIELD OF THE INVENTION

The present invention relates generally to cabinets for electronic equipment and, more particularly, to a telecommunications cabinet for housing telecommunications equipment in outdoor locations.

BACKGROUND OF THE INVENTION

Telecommunications equipment is typically designed for indoor temperature controlled environments, but is often deployed in outdoor locations. When telecommunications equipment is deployed in outdoor locations, a cabinet is typically used to provide environmental protection and control thermal conditions within the design limits of the telecommunications equipment.

There are essentially two main approaches to housing telecommunications equipment in outdoor cabinets—sealed cabinets and ventilated cabinets. Ventilated cabinets use natural or forced convection to draw ambient air through the cabinet to cool the equipment inside. Natural convection is only feasible for low density heat dissipation. At moderate and high power densities, forced ventilation is required.

Conventional cabinet ventilation systems use one or more fans to draw enough air into the cabinet to maintain the temperature below maximum equipment limits and to return the heated air to the outside environment. At low temperatures, the fans are turned off by a thermostat. In extremely cold climates, an electric heater is used to maintain the cabinet temperature within minimum equipment temperatures.

A drawback to the use of ventilated cabinets is that the control of the fans and heater is normally limited to on/off operation. This method of operation can lead to abrupt changes in temperature and create hot spots in the cabinet. In some cases, the equipment specifications limit the allowed rate of change in cooling air temperature to between 0.5 and 1.0° C. per minute. Ordinarily, this rate of change cannot be guaranteed with conventional ventilated cabinets.

Sealed cabinets provide an alternative to ventilated cabinets for housing telecommunications equipment in outdoor locations. Sealed cabinets provide maximum protection from airborne contaminants, but require special attention to the task of removing heat dissipated by the equipment. A variety of methods are used for removing the heat dissipated by the telecommunications equipment. At moderate power densities, circulation fans, air-to-air heat exchangers, or heat pipes may be used. At high power densities, or for installations where the ambient temperature may exceed the equipment limit, an air-conditioner may be required. In extremely cold weather, electric heaters are often required to maintain the minimum equipment temperature. All of these methods for thermal conditioning have certain disadvantages or limitations.

Heat exchangers and heat pipes require a relatively large difference between the ambient temperature and the equipment cooling air temperature in order to properly transfer heat, thereby restricting the use of such an approach to cooler ambient environments. The use of air-conditioners to control temperature within sealed cabinets also presents difficulties. The heat load from the equipment in some sealed cabinets is such that the air-conditioner is required to run even at low ambient conditions, sometimes as low as 0° F. Some units use variable speed-condenser blowers and/or a flooded condenser design to reduce the heat loss through the condenser and allow the air-conditioner to run at very low temperatures. Other units use a low-ambient vent to cool the cabinet with outside air when the temperature is too low to run the air conditioner. These solutions increase the cost and size of the cooling system. In addition, for small cabinets designed for locations with severe space limitations, using an air conditioner is a significant size penalty. Air conditioners are also a source of noise which may preclude their use in noise sensitive environments.

SUMMARY OF THE INVENTION

The present invention is a telecommunications equipment cabinet particularly adapted for use in outdoor locations. The cabinet comprises an enclosure having an electronics subrack for containing the telecommunications equipment. The enclosure includes an inlet opening in a lower portion of the cabinet for drawing cool ambient air into the cabinet. An exhaust outlet for exhausting heated air is disposed in an upper portion of the cabinet. In the preferred embodiment, the cabinet includes a segregated air routing system to direct air from the inlet, through the subrack, and out of the cabinet. The segregated air routing system includes a duct that extends from the air inlet to a subrack plenum disposed directly below the electronics subrack. An exhaust plenum is disposed immediately above the subrack and communicates with the exhaust outlet.

One or more fans draw cool ambient air into the cabinet. The cool ambient air flows through the inlet to the subrack plenum. A heater in the inlet duct heats the air at low ambient temperatures. The air is then pulled through the electronics in the subrack where the air picks up heat dissipated by the equipment. From the subrack, the heated air enters the exhaust plenum and is expelled through the exhaust outlet. The air flow is confined by the duct work in the cabinet for more effective control of cooling air flow rate and temperature.

The cooling system includes a thermal controller for monitoring the temperature within the cabinet and for controlling the operation of the fan(s) and the heater. The thermal controller is typically a microprocessor-based controller that receives as input the subrack inlet air temperature, the subrack exit air temperature, subrack equipment temperature, and outdoor ambient air temperature. At low ambient temperatures (low temperature mode), the controller of the preferred embodiment causes the fans to operate at reduced capacity to maintain a nearly constant air flow through the subrack. The power to the heating element is varied to maintain the subrack inlet temperature constant over a predetermined temperature range up to a first predetermined temperature. In moderate temperatures, the power to the heating element is turned off and the air flow is increased non-linearly as the temperature increases so as to maintain the temperature at the subrack exit constant. At high temperatures, the fans operate at full capacity.

The cabinet of the present invention is able to cool the electronics in compliance with equipment requirements for cooling air temperature and rate of temperature change without the burdens of size, complexity, power consumption, and noise of an air-conditioned cabinet. Protection from air-borne contaminants is provided by filters disposed in the inlet duct.

DETAILED DESCRIPTION

Figure 1:
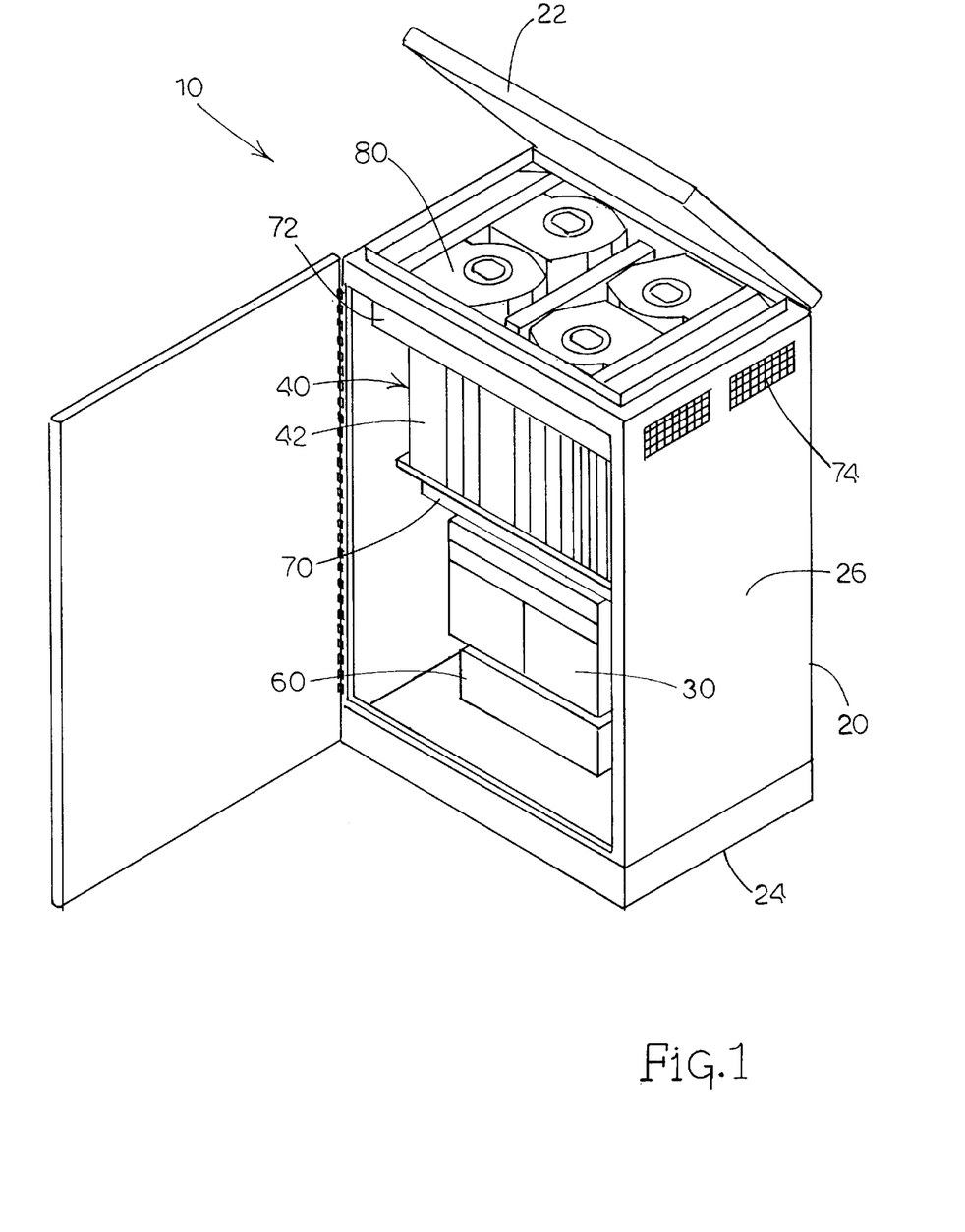
FIG. 1 is a perspective view of the telecommunications cabinet of the present invention with the enclosure shown in hidden lines.
Figure 2:
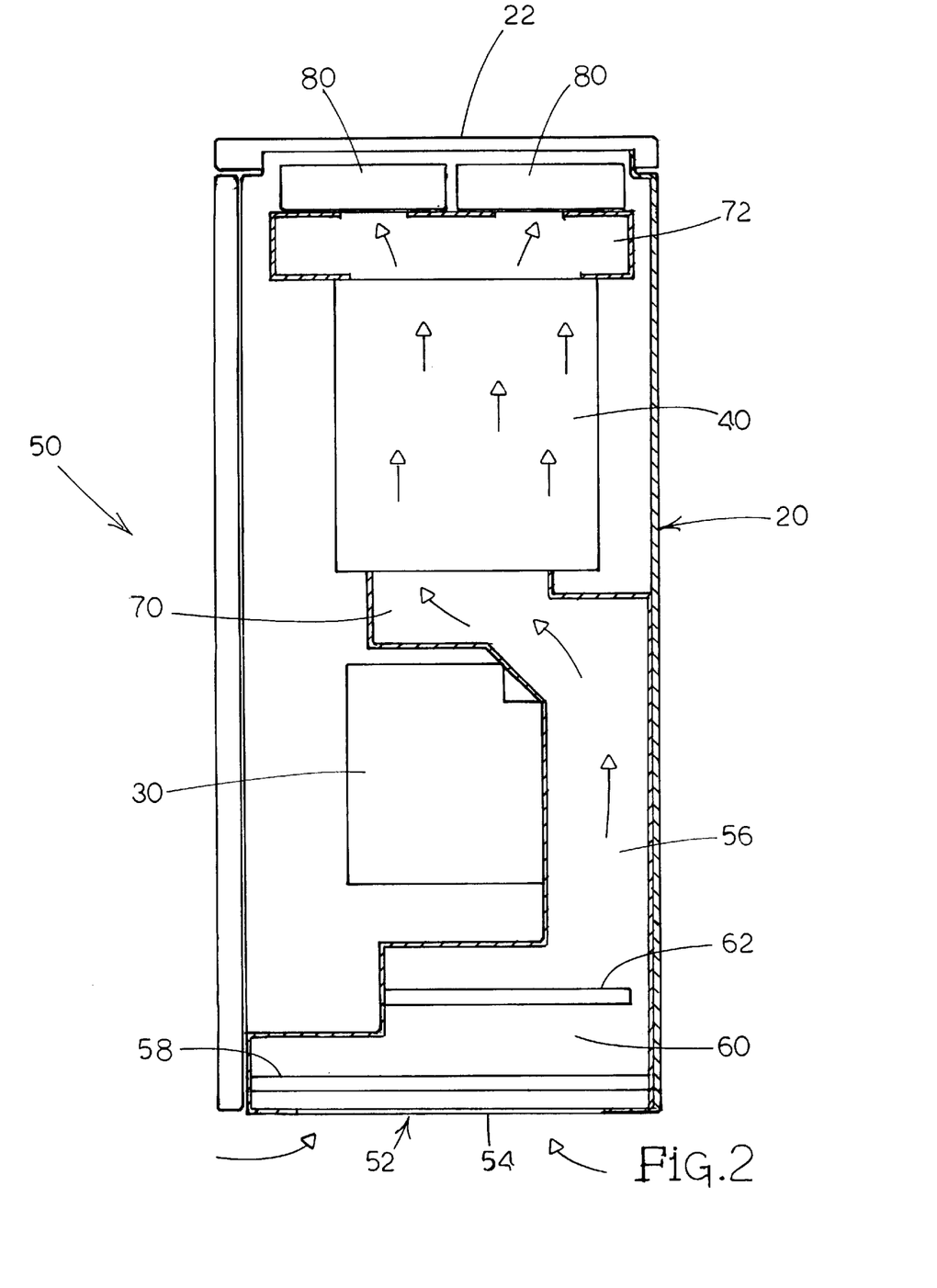
FIG. 2 is a section view of the telecommunications cabinet.
Figure 3:
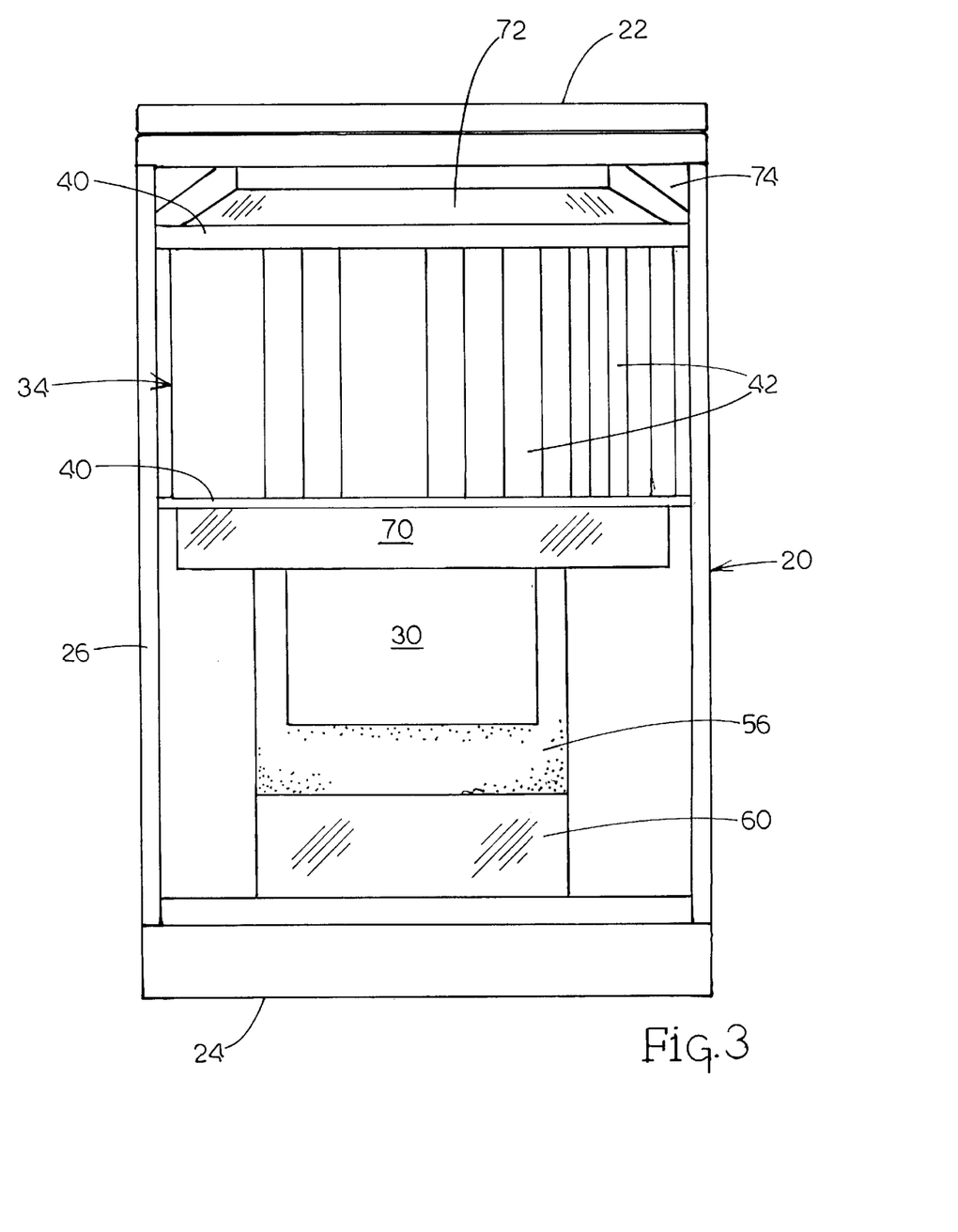
FIG. 3 is a front elevation view of the telecommunications cabinet.

An electronic equipment cabinet 10 includes various electronics housed within a suitable enclosure 20 having a top 22, a bottom 24, and sides 26. For purposes of illustration, the electronic equipment cabinet 10 will be described as housing telecommunications electronics 34 such as that required for a cellular telephone base station. Such electronic equipment cabinets 10 typically include both power electronics 32 and communications electronics 34. The power electronics 32 are typically separated from the communications electronics 34 by a suitable power distribution box 30 so as to reduce the hazards associated with servicing the communications electronics 34. The communications electronics 34 typically include a variety of communication circuit modules 42. The circuit modules 42 typically take the form of removable circuit cards disposed in a vertical orientation and supported by an electronics subrack 40 within the cabinet enclosure 20. The particular details of the configuration and operation of the power electronics 32 and communications electronics 34 are well known to those skilled in the art and are not discussed further herein except as to assist in understanding the present invention.

When operating, the communications electronics 34 within the electronic equipment cabinet 10 should be cooled to help prevent malfunctions or damage; this is particularly true for electronic equipment cabinets 10 in locations that are not in temperature controlled environments, such as outdoor environments. The electronic equipment cabinet 10 of the present invention includes a cooling system 50 to cool the communications electronics 34. The cooling system 50 provides a flow of cooling air across the communications electronics 34. In general, the airflow is in via one or more inlet vents 52, through a inlet duct 56 to a subrack inlet plenum 70, through the electronics subrack 40 to an subrack exhaust plenum 72, and out one or more exhaust vents 74. At least one fan 80, and preferably a plurality fans 80, are disposed downstream from the electronics subrack 40 and pull external air along this airflow path.

In one embodiment, the inlet vent 52 is disposed along the bottom of the enclosure 20 and is guarded by a inlet grill 54 sized to keep out larger nesting and stinging insects and the like. Equivalently, the inlet vent 52 may be disposed along the sides 26 of the enclosure 20 near the bottom 24. The inlet duct 56 connects to the inlet vent 52 and includes a lower portion and an upper portion. The lower portion preferably includes a filter 58 and a heating chamber 60. The filter 58 helps remove airborne fibers and further helps control the ingress of insects. The heating chamber 60 includes one or more heating elements 62. The heating element 62 is used to preheat the cooling air entering from the outside when it is cold so that the air entering the subrack inlet plenum 70 is above the minimum cooling air temperature specified for the equipment. Preferably, the power density of the heating element 62 is limited, such as in the range of 6 watts per square inch of heater surface area or less, to minimize radiant heating of the electronics subrack 40 and other equipment within the radiation field of the heating element 62 and to avoid reaching flammability limits of adjacent components and/or foreign objects entrained in the airflow. The heating element 62 is preferably an electric resistance heater and is controlled by the thermal controller 100 as more fully described below. Preferably, the power for the heating element 62 is regulated by a triac 64 having on/off zero crossing detection so as to minimize electromagnetic interference on any associated AC power lines. The upper portion of the inlet duct 56 connects to the subrack inlet plenum 70. The subrack inlet plenum 70 is a generally open area, preferably disposed below the electronics subrack 40, which is designed to distribute the air being supplied to the electronics subrack 40.

Air from the subrack inlet plenum 70 flows through the electronics subrack 40 so as to cool the communications electronics 34 therein. Typically, but not necessarily, the airflow is vertically through the electronics subrack 40, between the spaced apart circuit cards. Because the cooling system 50 of the present invention may not be equipped with humidity control, and to protect from other contamination, it may be advisable to employ conformal coatings, protective (but thermally conductive) barriers, sealants, or the like to keep airborne contaminants and moisture from direct contact with the communications electronics components.

Air from the electronics subrack 40 exits from the subrack into the subrack exhaust plenum 72. The subrack exhaust plenum 72 is a generally open area which collects the airflow from the electronics subrack 40 and channels it to the fans 80. The fans 80 pull the air through the electronics subrack 40 and exhaust the same to the outside through the exhaust vents 74. While only one fan 80 is required, it is preferred that a plurality of fans 80 be used to reduce overall size and provide redundancy in case of fan failure. The capacity and number of fans 80 should vary depending on the desired capacity of the cooling system 50. Each fan 80 should be variable speed over a wide range of speeds. Each fan 80 should be equipped with a backdraft damper to prevent recirculation of cooling air through any fans 80 that are not in use. To provide a redundant backup, it is preferred that one fan 80 be held in reserve. In the event that the optional fan speed sensors indicate that one of the main fans 80 is not operating properly, such as when the detected speed is 75% or less than the desired speed, the reserve fan 80 may be substituted for the malfunctioning fan 80.

Figure 4:
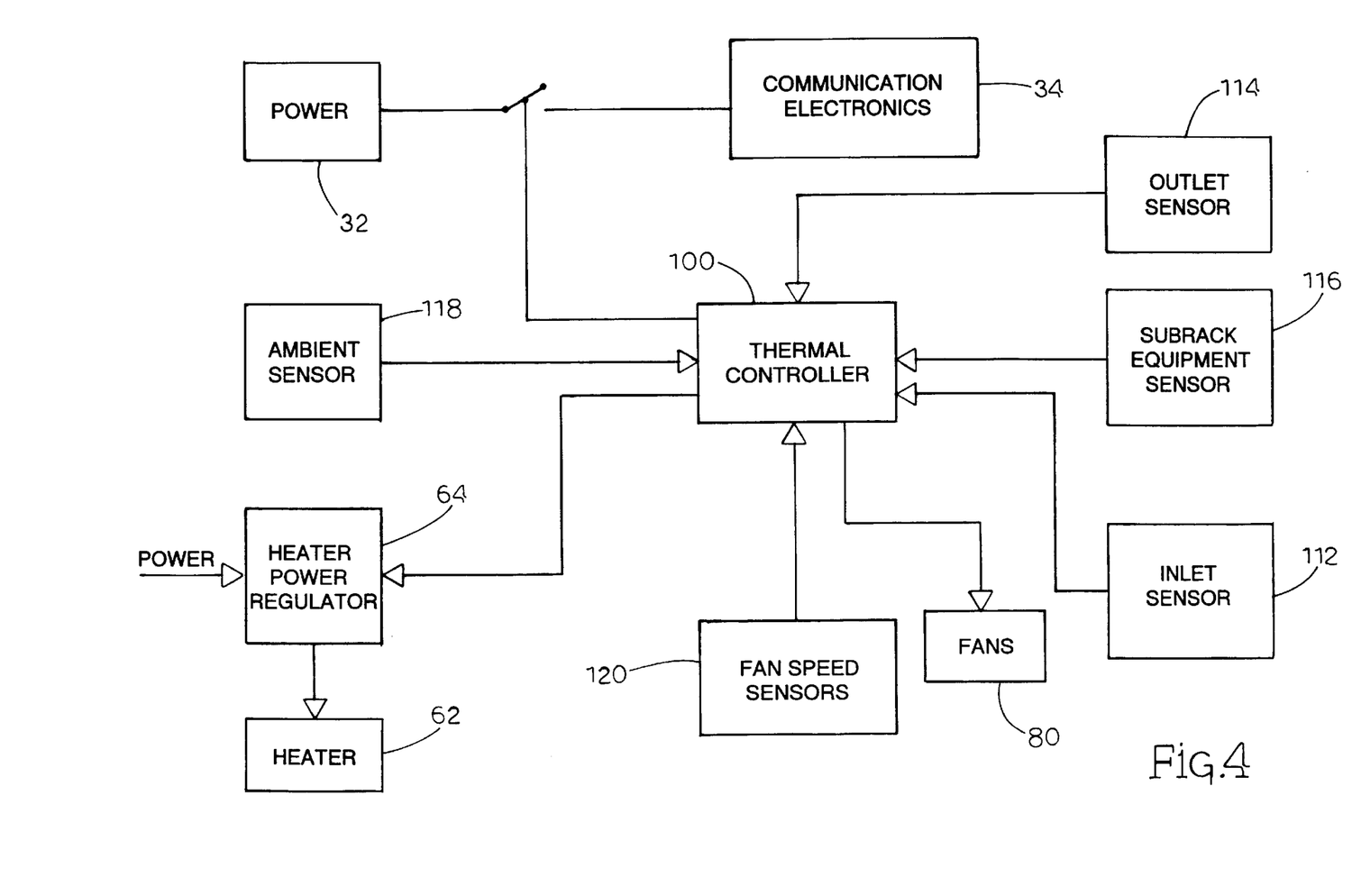
FIG. 4 is a block diagram of the control system for the telecommunication cabinet.

A thermal controller 100 controls the operation of the heating element 62 and the fans 80. The thermal controller 100 includes suitable control electronics, a plurality of temperature sensors 112,114,116,118, and optional fan speed sensors 120 for each fan 80. The temperature sensors 112,114,116,118 typically include a pair of subrack inlet temperature sensors 112, one primary and one backup, a subrack outlet temperature sensor 114, a subrack equipment temperature sensor 116 and an ambient air temperature sensor 118. The subrack inlet temperature sensors 112 should be located in the center of the subrack inlet plenum 70, downstream from the heating element 62 if present. The subrack outlet temperature sensor 114 should be located in the center of the subrack exhaust plenum 72. The subrack equipment temperature sensor 116 should be mounted to a dummy circuit card (not shown) in the electronic subrack 40 having the same thermal mass as an operational circuit card. The ambient air temperature sensor 118 should be located on a suitable exterior surface of the enclosure 20, such as in an external cavity near the inlet vent 52.

The thermal controller 100 controls the airflow through the cooling system 50, and the power of the heating element 62, to maintain the temperature of the cooling air supplied to the electronics subrack 40 within suitable thermal limits. There are preferably at least three main operational modes for the thermal controller 100—low temperature, moderate temperature, and high temperature. The operational mode is chosen based on the subrack inlet temperature as indicated by the subrack inlet air temperature sensor 112. For instance, the low temperature mode may apply when the subrack inlet temperature is less than 150° C., the moderate temperature mode may apply when the subrack inlet temperature is between 15° C. and 35° C., and the high temperature mode may apply when the subrack inlet temperature is above 35° C.

In the low temperature mode, the fans 80 generate a constant airflow, such as 33% of capacity, while the heating element 62 is enabled. Preferably the heating element 62 is powered just enough to maintain the temperature of the air being supplied to the electronics subrack 40 just above the minimum cooling air temperature limit. In this mode, the subrack inlet temperature sensor 112 provides the primary feedback to the thermal controller 100.

In the moderate temperature mode, the heating element 62 is off, but the fans 80 are enabled. Preferably, the number and speed of the fans 80 are varied so as to maintain the temperature of the air exiting the electronics subrack 40 just below the maximum temperature limit. In order to efficiently control the airflow, it is preferred that the thermal controller 100 be able to independently control the speed of each fan 80. In this mode, the subrack inlet temperature sensor 112 provides the primary input to the thermal controller 100. The subrack outlet temperature sensor 114 is used to detect excessive temperatures in the subrack exhaust plenum and to generate an alarm.

In the high temperature mode, the heating element 62 is off, and the fans 80 operate at full capacity.

In addition, the thermal controller 100 should optionally be able to operate in a cold start mode. Cold start mode is applicable when power is first supplied to the communications electronics 34 and the temperature of the communications electronics 34, as indicated by the subrack equipment temperature sensor 116, is below the allowed minimum temperature. In this mode, the communications electronics 34 is turned off until the electronics subrack 40 can be preheated to within specification limits. During start-up, the fans 80 operate to produce a reduced airflow, such as 20%, while the heating element 62 is engaged. Preferably, the heated air within the inlet duct 56 is heated by the heating element 62 to a temperature at or near its maximum allowed temperature, such as 45° C. Heated air from the inlet duct 56 is thereby pulled through the electronics subrack 40, heating the components within the electronics subrack 40. Once the electronics subrack 40 reaches the allowed minimum temperature, the communications electronics 34 are turned on.

The functioning of the present invention may best be described in the context of cooling communications electronics 34 having specified maximum and minimum incoming cooling air temperatures, maximum cooling air temperature rise across the communications electronics 34, and a maximum cooling air exhaust temperature from the communications electronics 34. Further, the communications electronics 34 may have a limitation on the maximum rate of change in temperature for the incoming cooling air. For purposes of illustration, the following values will be used:

| | |
|---|---|
| Incoming cooling air temperature | +5° C. to 45° C. |
| Maximum cooling air temperature rise at maximum air flow | 10° C. |
| Maximum exhaust temperature | 55° C. |
| Maximum rate of temperature change | 0.5° C./min. |

Figure 5:
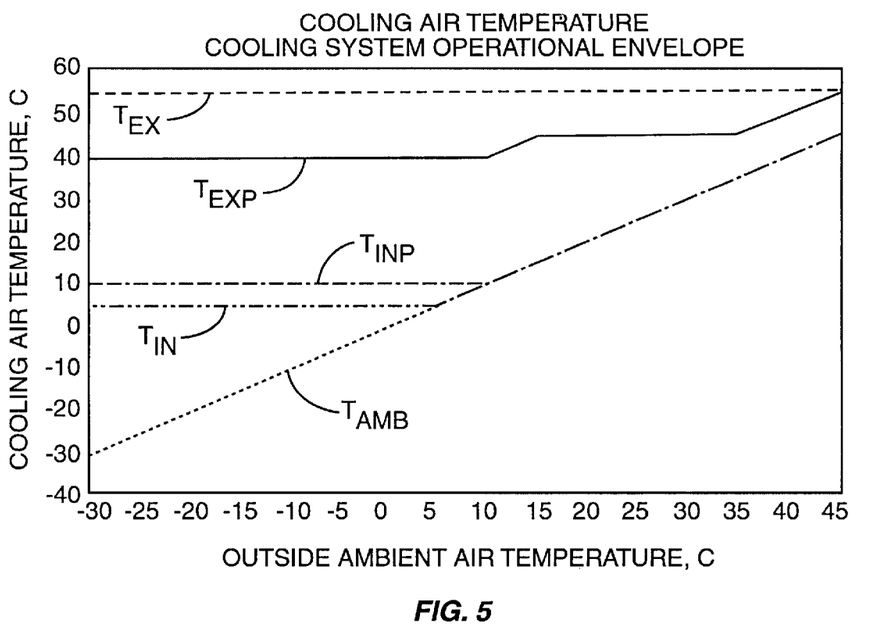
FIG. 5 is a graph illustrating the theoretical and practical thermal envelopes for the telecommunications cabinet over a range of ambient temperatures.

FIG. 5 shows the allowed theoretical thermal envelope for such a system as bounded by the maximum exhaust temperature (Tex) and the minimum incoming cooling air temperature (Tin). This theoretical thermal envelope is narrowed in practice to allow for system temperature and control tolerances. The practical thermal envelope is bounded by the maximum practical exhaust temperature (Texp) and the minimum practical incoming cooling air temperature (Tinp). Because it is assumed that the cooling system 50 of the present invention uses ambient outdoor air to cool the communications electronics 34, the thermal envelopes are additionally bounded on their lower side by the actual ambient air temperature (Tamb).

Figure 6:
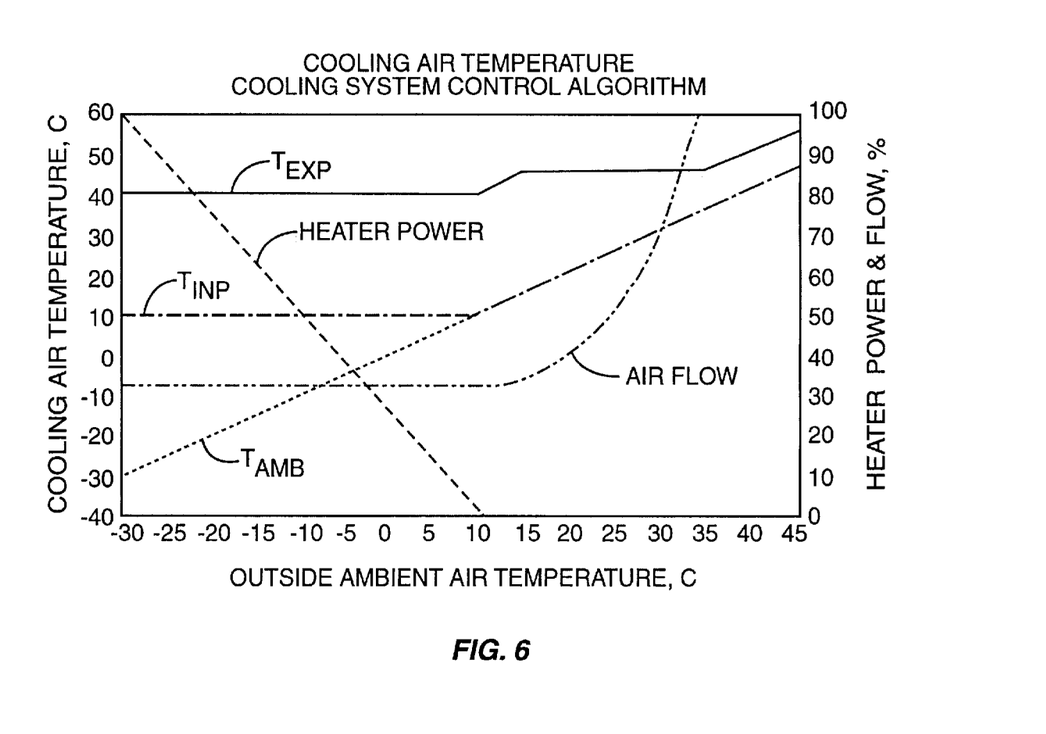
FIG. 6 is a graph illustrating the operation of the thermal control system for the telecommunications cabinet over a range of ambient temperatures.

The objective of the thermal controller 100 is to control the temperature and flow of the air in the subrack inlet plenum 70 and the subrack exhaust plenum 72 within the practical thermal envelope, thereby maintaining the temperature of the electronics subrack 40 within specification limits. In order to do so, the thermal controller 100 may function as shown in FIG. 6. At low outside temperatures, such as below 15° C., the thermal controller 100 operates in low temperature mode and causes the fans 80 to operate at a reduced flow rate of about 33%, and the heating element 62 is supplied with power according to line "Heater Power". Note that the heating element 62 may be disabled above 10° C. for reasons described below. Above 35° C., the thermal controller 100 operates in high temperature mode, disabling power to the heating element 62 and running the fans 80 at full capacity. Between 15° C. and 35° C., the thermal controller 100 operates in moderate temperature mode, disabling the heating element 62 and varying the flow rate of the fans 80 according to line "Air Flow". As shown, the airflow rate may vary non-linearly with temperature in the moderate temperature mode.

Figure 7:
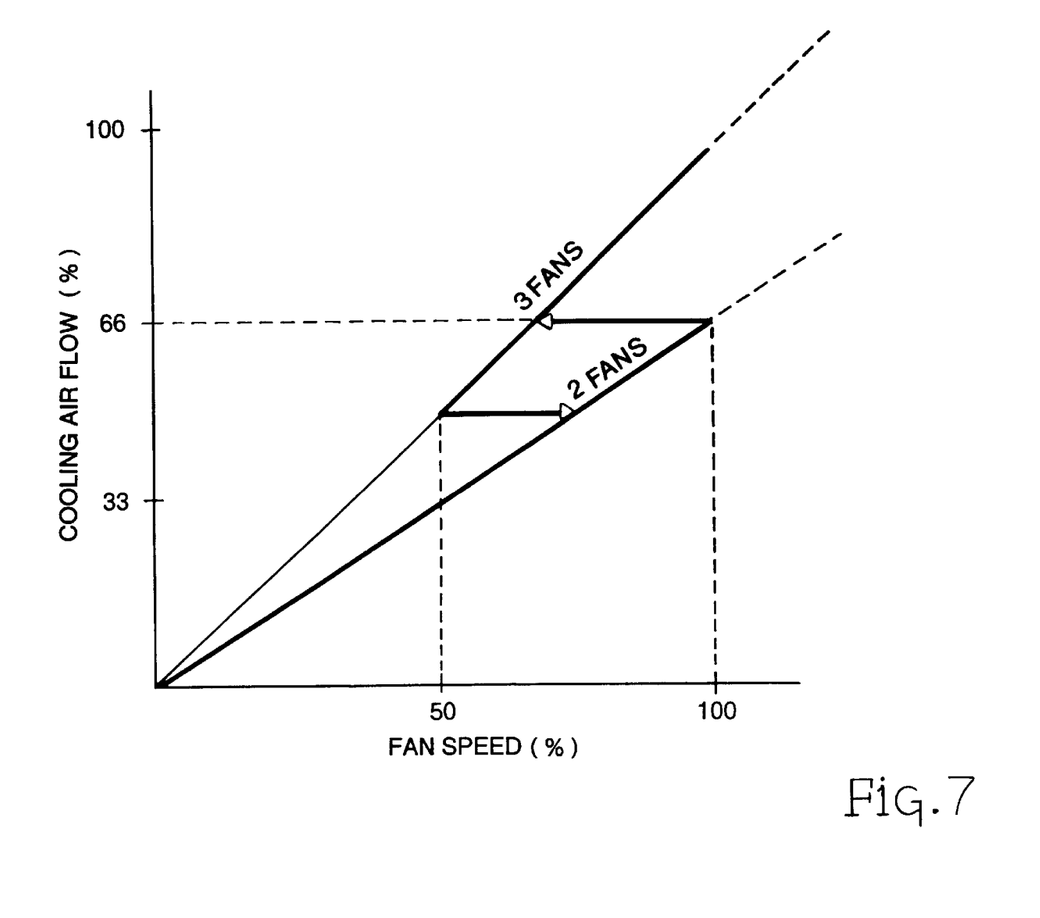
FIG. 7 is a graph illustrating the fan operation of one embodiment.

In one embodiment utilizing three main fans 80, only selected fans 80 are used at lower flow rates, with other fans 80 being activated for higher airflow rates. This method of operation is shown in FIG. 7. For instance, in the low temperature mode, two fans 80 are operated at half speed and the third is off. The reason for using two fans 80 is that control of fan speed is limited to 50%–100% by fan manufacturer design constraints. In the moderate temperature mode, two fans 80 are used with increasing speeds at the lower airflow rates, and the third fan 80 is activated at the higher airflow rates. In order to facilitate a smooth airflow transition from two to three fans 80, the speed of the first two fans 80 is reduced when the third fan 80 is turned on. After the third fan 80 is activated, all three fans 80 are ramped up in speed if additional airflow is required. If the ambient temperature begins dropping, the inverse procedure is used to transition from three fans 80 to two. Thus, in this embodiment, the airflow through the electronics subrack 40 does not change dramatically when the number operating fans 80 changes to provide increased or decreased airflow through the cooling system 50. The transition from two fans to three fans occurs at a first pre-determined air flow rate when demand for air flow is increasing. The transition from three fans to two fans occurs at a second air flow rate when the demand for air flow is decreasing. The first air flow rate and second air flow rate are different (see FIG. 7) to prevent the fans from jittering.

By varying the operation of the heating element 62 and the fans 80 as shown in FIG. 6, operation may be maintained within the thermal envelope. In addition, power consumption is substantially reduced. While the ambient temperature is lower than $T_{inp}$, the heating element 62 is engaged and a small flow of air is induced. However, the heating element 62 need not be fully engaged; it is only necessary that the subrack inlet temperature be at or just above the $T_{inp}$. Thus, heater power varies inversely with $T_{amb}$ and stops completely when the $T_{amb}$ is at or above $T_{inp}$. Further, in the moderate temperature mode, the subrack inlet temperature need only be sufficient to keep the subrack outlet temperature at or below $T_{exp}$. In order to maintain the subrack exit air temperature below its maximum, air flow will increase as subrack inlet temperature rises.

In addition, it should be noted that the variation in fan airflow may need to be higher than that indicated by air flow in FIG. 6 when the comparison of the subrack exhaust temperature sensor 114 and the subrack inlet temperature sensor(s) 112 indicates that the temperature rise across the electronics subrack 40 is more than the allowed temperature rise. Further, the heating element 62 power and the fan 80 airflow may have to vary from the ideal represented in FIG. 6 to accommodate the restriction on maximum rate of change in subrack inlet temperature. For instance, the heating element 62 may be supplied with less power than indicated when the ambient temperature is rising rapidly in the morning after a cold night.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A cabinet for housing operative telecommunications equipment in outdoor locations comprising:
   a) an enclosure for containing said operative telecommunications equipment, said enclosure adapted to be located outdoors;
   b) an electronics subrack contained within said enclosure and adapted to hold one or more circuit modules during operation of said telecommunications equipment;
   c) a duct for directing ambient air from outside said cabinet to said subrack, said duct including an inlet disposed adjacent a lower end of said cabinet and a subrack inlet plenum disposed adjacent to an underside of said electronics subrack, wherein said duct includes a heating chamber between said inlet and said subrack inlet plenum;
   d) a subrack exit plenum including an outlet disposed adjacent an upper side of said electronics subrack; and
   e) at least one fan for drawing ambient air into said inlet, through said duct into said subrack inlet plenum, through said electronics subrack into said subrack exit plenum, and through said outlet out of said enclosure.

2. The cabinet of claim 1 further including a heating element disposed within said heating chamber for heating ambient air drawn through said inlet.

3. The cabinet of claim 2 wherein said heating element is an electric resistance heater.

4. The cabinet of claim 2 further including a thermal controller for controlling power to said heating element.

5. The cabinet of claim 4 wherein, in a low temperature mode, said thermal controller maintains air flow constant and varies power to said heating element.

6. The cabinet of claim 5 wherein, in a moderate temperature mode, said thermal controller varies said air flow and shuts off power to said heating element.

7. The cabinet of claim 6 wherein said air flow is varied non-linearly in said moderate temperature mode.

8. The cabinet of claim 6 wherein said air flow is varied in said moderate temperature mode so as to maintain outlet temperature constant within the operational limits of the fan.

9. The cabinet of claim 6 wherein, in a high temperature mode, the thermal controller shuts off power to said heating element and operates said fan at maximum capacity.

10. The cabinet of claim 4 wherein said thermal controller operates said heating element and said fan to maintain the rate of change of temperature in said subrack inlet plenum to less than 0.5° C. per minute.

11. A cabinet for housing telecommunications equipment in outdoor locations comprising:
   a) an enclosure for containing said telecommunications equipment;
   b) an electronics subrack contained within said enclosure;
   c) an inlet opening disposed in a lower end of said cabinet below said subrack to allow ambient air to enter said enclosure;
   d) an outlet opening disposed in an upper portion of said cabinet above said subrack to expel air from said cabinet;
   e) at least one fan for drawing ambient air into said inlet, through said subrack and out of said outlet opening;
   f) a heating element for heating ambient air drawn in through said inlet before the air reaches said subrack;
   g) a thermal controller for controlling the operation of said heating element and said fan to maintain the temperature within said enclosure within a predetermined thermal envelope;
   h) wherein said thermal controller is operative to maintain air flow constant and vary power to said heating element at ambient temperatures in a low temperature mode, and shut off power to said heating element and to vary said air flow in a moderate temperature mode.

12. The cabinet of claim 11 wherein said air flow is varied non-linearly over a range of temperatures in said moderate temperature mode.

13. The cabinet of claim 11 wherein said airflow is varied in said moderate temperature mode so as to maintain outlet temperature constant within the operational limits of the fan.

14. The cabinet of claim 11 wherein said subrack having an inlet plenum and said thermal controller operates said heating element and said fan to maintain the rate of change of temperature in said subrack inlet plenum to less than 0.5° C. per minute.

15. The cabinet of claim 11 further including a duct within said cabinet to direct air from said inlet opening to said subrack.

16. The cabinet of claim 15 wherein said duct includes a heating chamber and wherein said heating element is disposed in said heating chamber.

17. The cabinet of claim 11 wherein said heating element is an electrical resistance heater.

18. A cabinet for housing operative telecommunications equipment in outdoor locations comprising:

an enclosure for containing said operative telecommunications equipment, said enclosure adapted to be positioned outdoors;

an electronics subrack contained within said enclosure and adapted to hold one or more circuit modules during operation of said telecommunications equipment;

a duct for directing ambient air from outside said cabinet to said subrack, said duct extending through said enclosure from an air inlet disposed adjacent a lower end of said cabinet and a subrack inlet plenum disposed adjacent an underside of said electronics subrack, and defining a segregated air flow path within said enclosure;

a heating chamber in said duct between said air inlet and said subrack inlet plenum;

an exhaust extending from said subrack to an outlet in said enclosure; and at least one fan for drawing ambient air into said inlet, through said duct to said subrack, and exhausting air through said outlet in said enclosure.

19. The cabinet of claim 18 further including a heating element disposed within said heating chamber for heating ambient air drawn in through said inlet.

20. The cabinet of claim 19 wherein said heating element is an electric resistance heater.

21. The cabinet of claim 19 further including a thermal controller for controlling power to said heating element.

22. The cabinet of claim 21 wherein, in a low temperature mode, said thermal controller maintains air flow constant and varies power to said heating element.

23. The cabinet of claim 21, wherein, in a moderate temperature mode, said thermal controller varies air flow and shuts off power to said heating element.

24. The cabinet of claim 23 wherein said air flow is varied non-linearly in said moderate temperature mode.

25. The cabinet of claim 23 wherein said air flow is varied in said moderate temperature mode so as to maintain outlet temperature constant within the operational limits of the fan.

26. The cabinet of claim 23 wherein, in a high temperature mode, the thermal controller shuts off power to said heating element and operates said fan at maximum capacity.

27. The cabinet of claim 21 wherein said thermal controller operates said heating element and said fan to maintain the rate of change of temperature in said subrack inlet plenum to less than 0.5° C. per minute.

28. The cabinet of claim 18 wherein said cabinet further includes an equipment space disposed within said cabinet between said inlet and said subrack, and wherein said duct extends through said equipment space.

29. The cabinet of claim 28 further including power electronics contained within said equipment space.

30. A cabinet for housing operative telecommunications equipment in outdoor locations comprising:

an enclosure adapted to be positioned outdoors for containing said operative telecommunications equipment, said enclosure having an inlet and an outlet and defining an enclosed equipment space;

an electronics subrack contained within said enclosure and adapted to hold one or more circuit modules during operation of said telecommunications equipment, said electronics subrack dividing said equipment space;

a duct disposed within said enclosure for directing ambient air from outside said cabinet to said subrack, said duct extending through said equipment space from said inlet to said electronics subrack and defining a segregated air flow path within said equipment space;

an exhaust extending from said subrack to an outlet in said enclosure; and at least one fan for drawing ambient air into said inlet, through said duct to said subrack, and exhausting air through said outlet in said enclosure.

* * * * *